(12) United States Patent
Chen et al.

(10) Patent No.: US 7,646,160 B2
(45) Date of Patent: Jan. 12, 2010

(54) SENSOR CALIBRATION AND PARAMETER IDENTIFICATION IN A MULTI-PHASE MOTOR DRIVE

(75) Inventors: Chingchi Chen, Ann Arbor, MI (US); Jin Wang, Northville, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 392 days.

(21) Appl. No.: 11/796,081

(22) Filed: Apr. 26, 2007

(65) Prior Publication Data

US 2008/0265819 A1 Oct. 30, 2008

(51) Int. Cl.
*H02P 1/00* (2006.01)

(52) U.S. Cl. .................. 318/490; 318/491; 318/496; 318/288; 318/801

(58) Field of Classification Search ........... 318/800, 318/801, 288, 290, 490, 491, 496
See application file for complete search history.

(56) References Cited

U.S. PATENT DOCUMENTS

| | | | | |
|---|---|---|---|---|
| 3,909,687 A * | 9/1975 | Abbondanti | ............. | 318/805 |
| 4,864,483 A * | 9/1989 | Divan | ............. | 363/37 |
| 5,357,181 A | 10/1994 | Mutoh et al. | | |
| 5,677,611 A | 10/1997 | Yoshihara et al. | | |
| 5,739,649 A * | 4/1998 | Akao | ............. | 318/139 |
| 5,982,136 A * | 11/1999 | Pelly | ............. | 318/801 |
| 6,014,598 A | 1/2000 | Duyar et al. | | |
| 6,326,758 B1 | 12/2001 | Discenzo | | |
| 6,359,405 B1 | 3/2002 | Tsurumi | | |
| 6,850,426 B2 | 2/2005 | Kojori et al. | | |
| 6,989,641 B2 | 1/2006 | Schulz et al. | | |
| 7,397,216 B2 * | 7/2008 | Schroeder et al. | ............. | 318/629 |
| 7,486,034 B2 * | 2/2009 | Nakamura et al. | ............. | 318/139 |
| 2004/0145338 A1 * | 7/2004 | Nakamura et al. | ............. | 318/801 |
| 2004/0150359 A1 * | 8/2004 | Yaguchi et al. | ............. | 318/254 |
| 2007/0108936 A1 * | 5/2007 | Yaguchi | ............. | 318/800 |

* cited by examiner

*Primary Examiner*—Bentsu Ro
*Assistant Examiner*—Thai Dinh
(74) *Attorney, Agent, or Firm*—David B. Kelley; MacMillan, Sobanski & Todd, LLC

(57) ABSTRACT

In a multi-phase motor drive that includes a bus capacitor, a multi-phase motor, a multi-phase inverter, multiple switches each having an on-state and an off-state, and multiple current sensors each being in series with respective phase winding, a method for checking the accuracy of circuit parameters of the motor drive, including using the switches to produce a first loop that includes the capacitor bank, a first phase winding, a first current sensor, a second phase winding, and a second current sensor, using the current sensors to determine a magnitude of current in the first and second phase windings, comparing a magnitude of current indicated by the first current sensor and the second current sensor, and determining a magnitude of a difference between the current in the first and second phase windings.

21 Claims, 9 Drawing Sheets

SENSOR CALIBRATION AND PARAMETER IDENTIFICATION IN A MULTI-PHASE MOTOR DRIVE

BACKGROUND OF THE INVENTION

1. Field of the Invention

The invention relates generally to supplying electric power from a variety of sources, such as electric generators, solar cells, fuel cells and batteries, to various loads, such as electric appliances, motor drives and down-stream power converters.

2. Description of the Prior Art

Power electronics is an enabling technology which provides a means to regulate electric power supplied from a variety of sources to various loads. The power sources may include, but are not limited to, electric generators, solar cells, fuel cells and batteries. On the other hand, the loads may include, but are not limited to, electric appliances, motor drives and down-stream power converters. With foreseeable near-term and long-term global energy shortage, precise electric energy regulation using power electronics becomes indispensable. Examples include wind turbines, solar cells power-tracked by electronic converters, appliances operated by variable-speed electronic motor drives, hybrid electric vehicles, fuel-cell vehicles with high-power electronic converters and/or motor drives to maximize efficiencies.

To work under desired conditions, these power electronic converters and motor drives include a variety of sensors to monitor their operations. Accuracy and integrity of these sensors are therefore critical for proper operation and fault detection. The signals from these sensors are also useful for estimating the parameters of the systems, the power sources and the loads, which can be used to detect catastrophic failures or to monitor system aging.

There is a need in the industry for systems and methods to cross check the outputs of sensors and to estimate system parameters related to various systems including, but not limited to, power converters, home appliances, and vehicle electronic systems.

SUMMARY OF THE INVENTION

To address this need, this invention disclosure proposes methodologies to cross check the outputs of sensors and to estimate system parameters. These approaches can be used in many areas, including, but not limited to, power converters, home appliances, and on-vehicle electronic systems.

In a multi-phase motor drive that includes a bus capacitor, a multi-phase motor, a multi-phase inverter, multiple switches each having an on-state and an off-state, and multiple current sensors each monitoring the current on respective phase winding, a method for checking the accuracy and integrity of circuit parameters of the motor drive, including using the switches to produce a first loop that includes the capacitor bank, a first phase winding, a first current sensor, a second phase winding, and a second current sensor, using the current sensors to determine a magnitude of current in the first and second phase windings, comparing a magnitude of current indicated by the first current sensor and the second current sensor, and determining a magnitude of a difference between the current in the first and second phase windings.

The scope of applicability of the preferred embodiment will become apparent from the following detailed description, claims and drawings. It should be understood, that the description and specific examples, although indicating preferred embodiments of the invention, are given by way of illustration only. Various changes and modifications to the described embodiments and examples will become apparent to those skilled in the art.

DESCRIPTION OF THE DRAWINGS

These and other advantages will become readily apparent to those skilled in the art from the following detailed description of a preferred embodiment when considered in the light of the accompanying drawings in which.

DESCRIPTION OF THE PREFERRED EMBODIMENT

Figure 1:
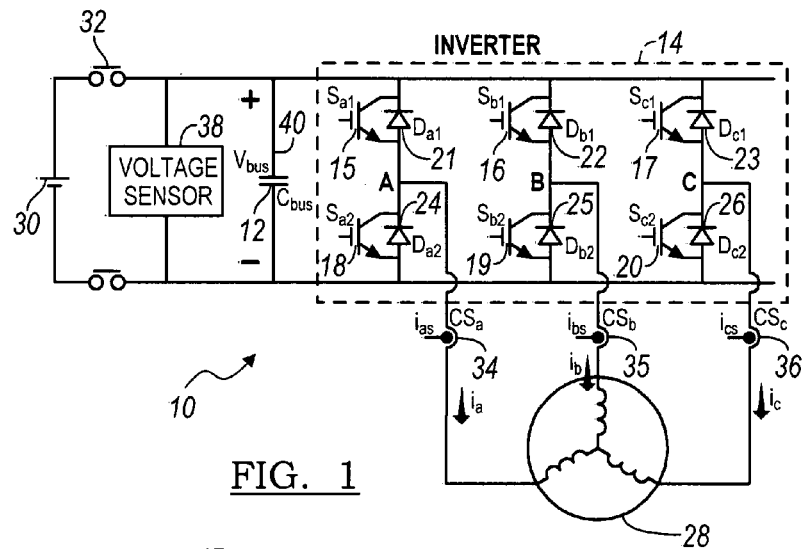
FIG. 1 is a schematic diagram of a multi-phase motor drive.

Referring to FIG. 1, a multi-phase motor drive 10, typically includes a DC capacitor bank 12 $C_{bus}$, a multi-phase inverter 14 with six switches 15-20, six anti-parallel diodes 21-26, and a multi-phase motor 28. The power may be supplied by a battery pack 30 through contactors 32. The drive system 10 includes current sensors 34, 35, 36 for signal monitoring and output control, each current sensor on each motor phase A, B, C, and a voltage sensor 38 on the DC bus 40.

Figure 2:
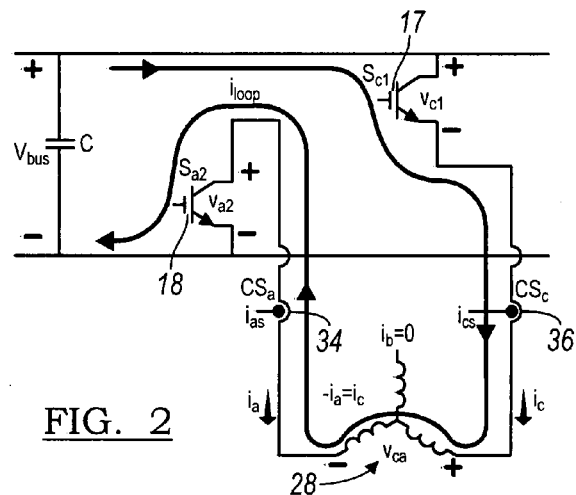
FIG. 2 illustrates a loop that carries the same current through two of the current sensors in the motor drive of FIG. 1.

FIG. 2 shows one way to cross-check the outputs of the current sensors 34, 36 of FIG. 1. In this specific case, Phase-C upper switch 17 $S_{c1}$ and the Phase-A lower switch 18 $S_{a2}$ are turned on while switches 15, 16, 19, 20 are off. Current passes through Phases A and C. The current sensors 34 $CS_a$ and 36 $CS_c$ should sense the same current except with opposite polarities. In other words, $$i_{loop} = i_c = -i_a \qquad (1)$$

Meanwhile, the B phase current is zero:

$$i_b = 0 \quad (2)$$

Equation (1) can be used to cross-check the two current sensors 34 and 36, and Equation (2) can be used to monitor the offset of the third current sensor 35. Different switch combinations can be chosen to cross-check other current sensor pairs as well as offsets of a third current sensor.

Also, while switches 17 and 18 are ON, the loop current $i_{loop}$ is governed by the following equation:

$$v_{ca} = v_{bus} - v_{c1} - v_{a2} = L\frac{d(i_{loop})}{dt} \quad (3)$$

wherein L is the inductance of the motor winding between Phase A and C, and the other parameters are as shown in FIG. 2.

Equation (3) can also be expressed in an integration form:

$$i_{loop} = \frac{1}{L}\int v_{ca} dt = \frac{1}{L}\int (v_{bus} - v_{c1} - v_{a2}) dt \quad (4)$$

If
$V_{bus} \gg v_{c1}$ and $V_{bus} \gg v_{a2}$ $$v_{bus} \approx L\frac{d(i_{loop})}{dt} \quad (5)$$

or $$i_{loop} \approx \frac{1}{L}\int v_{bus} dt \quad (6)$$

Equations (3)-(6) can be used to estimate the motor winding inductance, assuming the sensor signals $i_{loop}$ and $v_{bus}$ are accurate.

Figure 3:
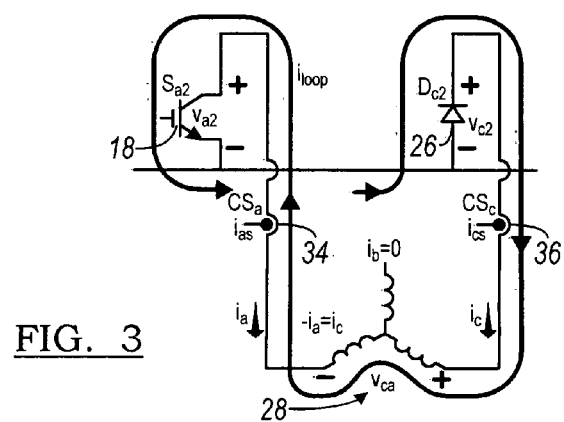
FIG. 3 shows a current loop through the motor windings, a diode, and a switch in the motor drive of FIG. 1.

When the current is increased to a desired amplitude, either switch 17 $S_{c1}$ or switch 18 $S_{a2}$ may be off, but not both. FIG. 3 shows with switch 17 $S_{c1}$ off and switch 18 $S_{a2}$ on that the motor current circulates through $S_{a2}$ and diode 26 $D_{c2}$, and the loop current can be described by:

$$v_{c2} - v_{a2} = L\frac{d(i_{loop})}{dt} \quad (7)$$

Based on the estimated motor winding inductance L from Equations (3)-(6), the forward-voltage drop ($v_{c2}$-$v_{a2}$) can be estimated by Equation (7). Similarly, the inductance of other motor winding pairs and the forward voltage drops of other semiconductor pairs can be estimated.

Equations (1)-(7) can be applied to determine the magnitude of the variables during system start-up, idling, or shutdown processes.

Figure 4:
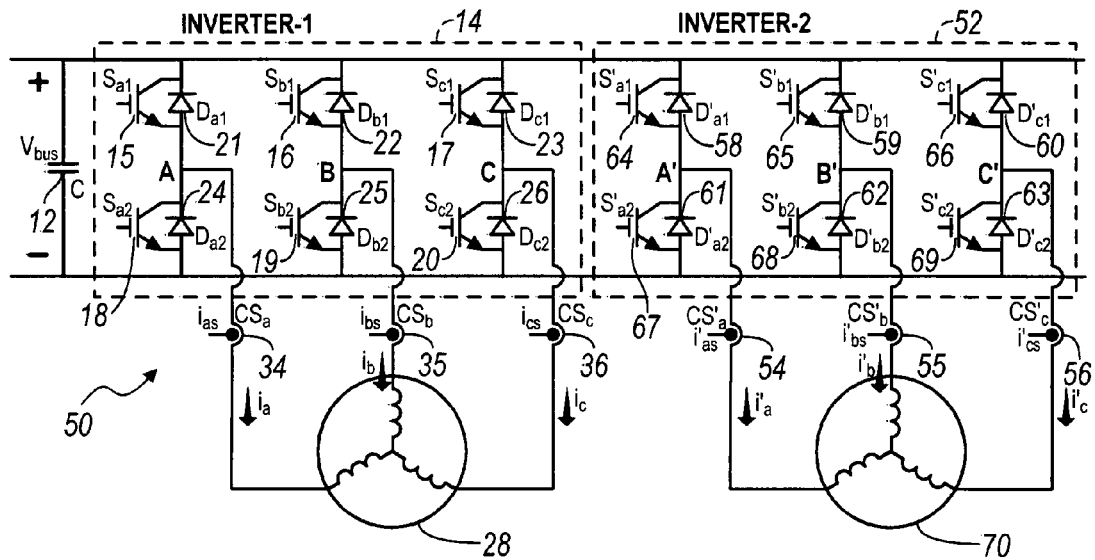
FIG. 4 is a schematic diagram of two motor drives that share the same DC bus.
Figure 5:
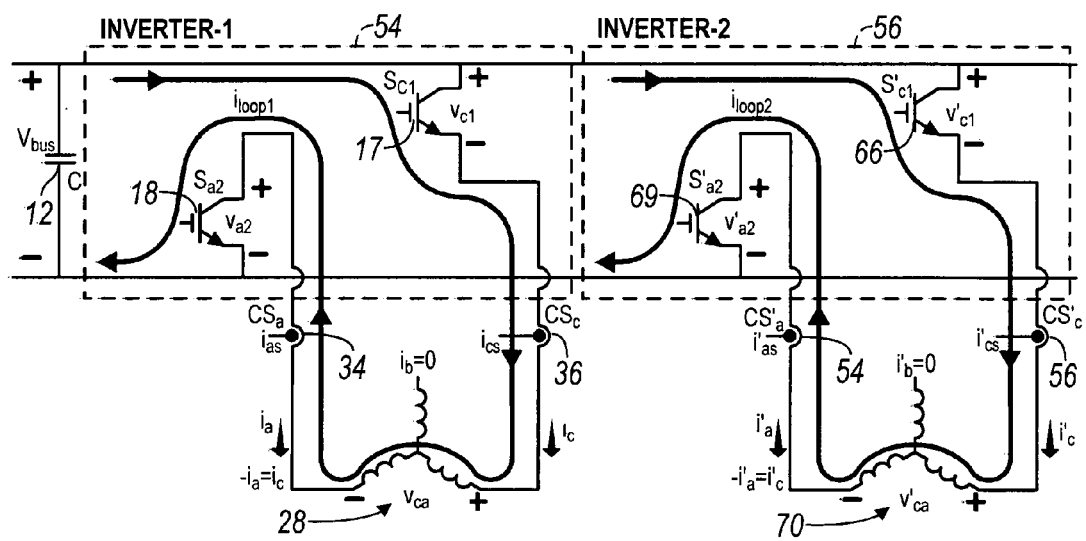
FIG. 5 illustrates loops carrying currents through the two motors of the motor drive of FIG. 4.
Figure 6:
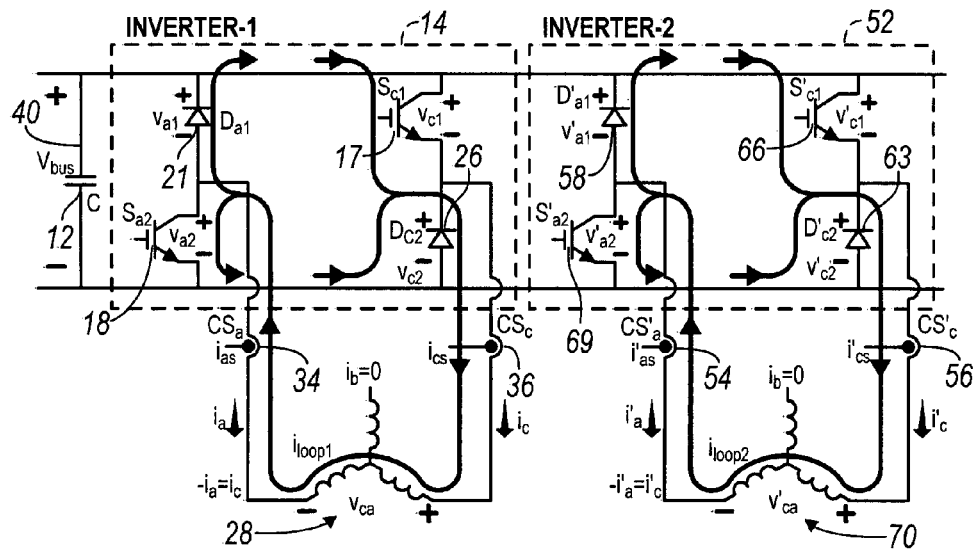
FIG. 6 illustrates current loops through the motor windings, diodes, and switches in the motor drive of FIG. 4.
Figure 7:
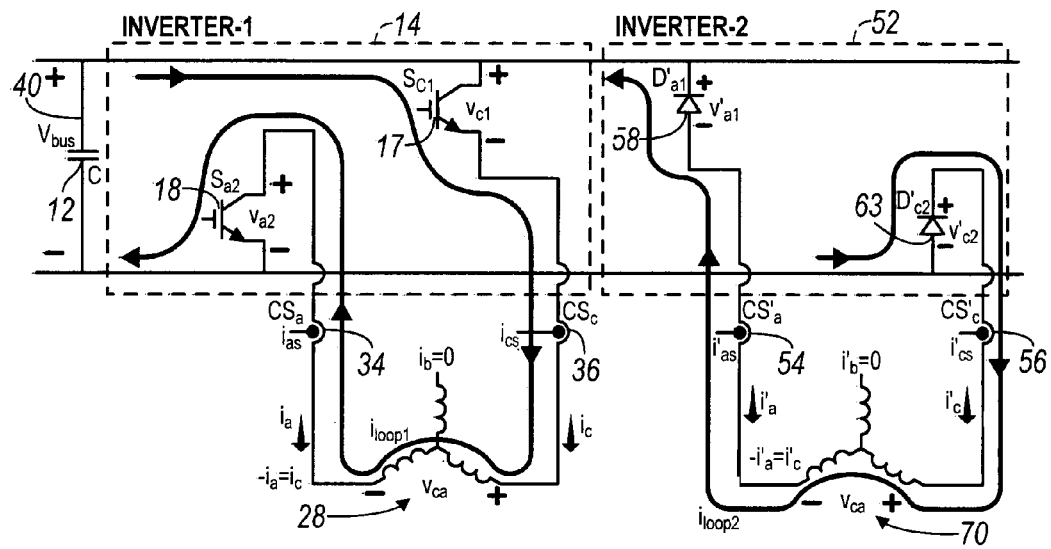
FIG. 7 illustrates the motor drive of FIG. 4 with the switches with higher circulating current turned off.

FIG. 4 shows a multi-phase motor drive 50 wherein the DC bus 40 is shared by multiple inverters 14 and 52. Inverter 14 includes multiple current sensors 34-36, diodes 21-26 and switches 15-20. Inverter 52 includes multiple current sensors 54, 55, 56, diodes 58-63 and switches 64-69. Again, the current sensors associated with their respective inverter and motor can be cross-checked using the strategies described above with reference to FIGS. 1-3. FIGS. 5-7 illustrate cross-checking the current sensors for inverters 14 and 52. Preferably, the current sensors are cross-checked with the power source, i.e., battery pack 30, disconnected. Then, the electric charge remaining in the bus capacitor 12 $C_{bus}$ is the only energy source for the following process.

FIG. 5 shows that the two inverters 14, 52 are regulated to deliver approximately equal magnitudes of current to the two motors 28, 70 until the energy in capacitor 12 is exhausted.

When the dc bus voltage collapses to zero, the motor currents circulate through the windings of motors 28, 70, diodes 21, 26, 58, 63 and switches 17, 18, 66, 69, as shown in FIG. 6. However, even with good control, the motor currents are not equal; one will be larger than the other.

FIG. 7 assumes that motor 70 has the higher circulating current. To confirm, all switches 64-69 in inverter 52 are turned off. This forces the current through motor 70 to return to the dc bus 40 through the diodes 58 and 63, as shown in FIG. 7. Since this current is larger than the current through inverter 14 and motor 28, the dc bus voltage increases and becomes positive. However, if the current in motor 70 is only slightly higher than the current in motor 28, the net dc bus current is very small and the dc bus voltage is increased very slowly.

With slightly positive dc bus voltage, the current in motor 70 will be reduced, while that of motor 28 will be increased. This forces these currents to become equal eventually. When these two currents are equal in amplitude momentarily, the net dc bus current is zero, as is the slope of the dc bus voltage. In other words, the dc bus voltage (a small positive value) and its slope become excellent indicators to determine when these two currents are exactly equal. When the conditions are met, the four current sensors 34, 36, 54, 56 associated in the process should provide the same signal amplitude.

Figure 8:
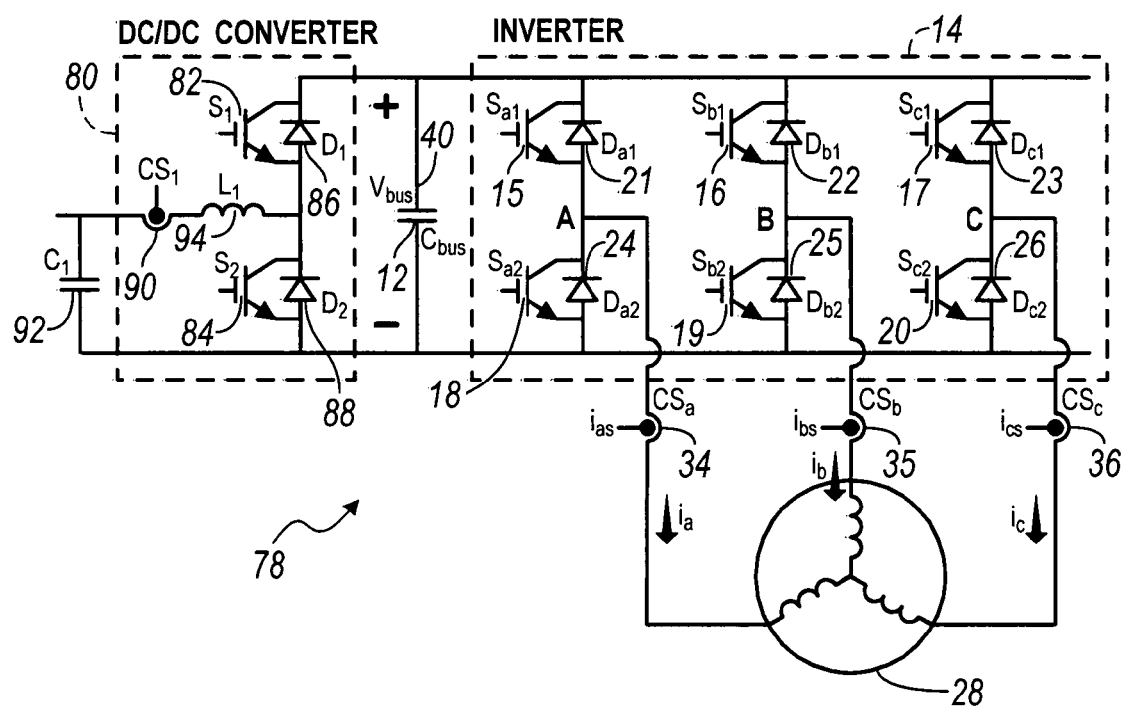
FIG. 8 is a schematic diagram of a multi-phase motor drive with a boost converter.
Figure 9:
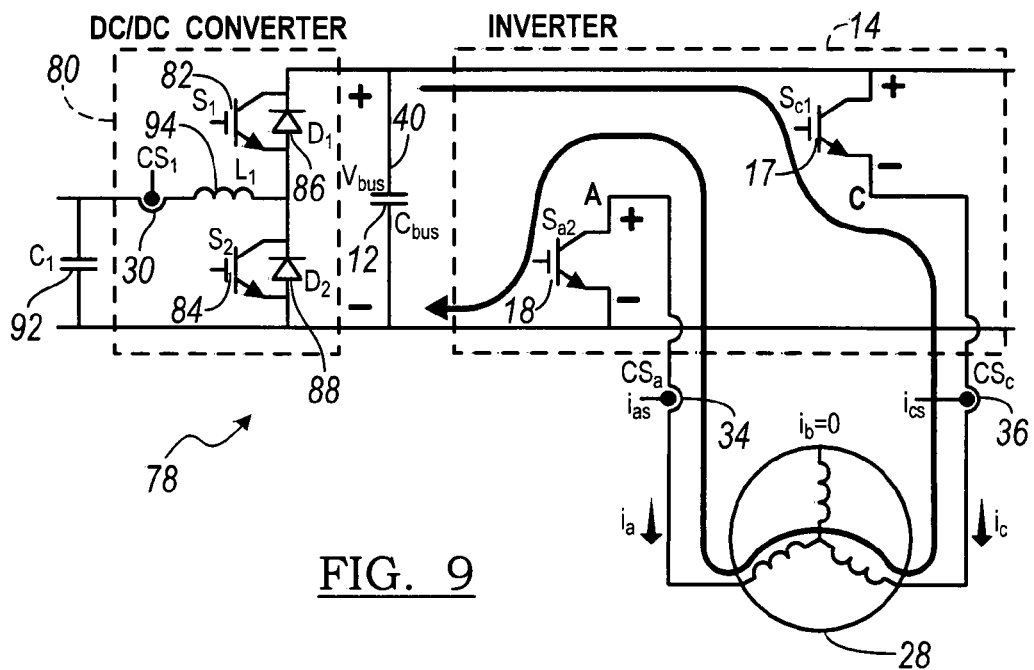
FIG. 9 illustrates two inverter switches used to discharge the bus capacitor of the motor drive of FIG. 8.

A similar procedure can also be applied to cross-checking current sensors of a system 78 that includes a boost converter 80 and the inverter 14, as illustrated in FIG. 8. The converter 80 includes switches 82, 84, diodes 86, 88, a current sensor 90, capacitor 92, and inductor 94. In FIG. 8, current sensor 90 $CS_1$ of the DC/DC converter 80 can be cross-checked with the current sensors 34-36 $CS_a$, $CS_b$, or $CS_c$ of inverter 14. The procedure is described with reference to FIGS. 9 and 10. First, the DC bus 40 is disconnected from the power supply 30 and the charge in capacitors 92 $C_1$ and 12 $C_{bus}$ is the remaining energy on the DC bus.

Figure 10:
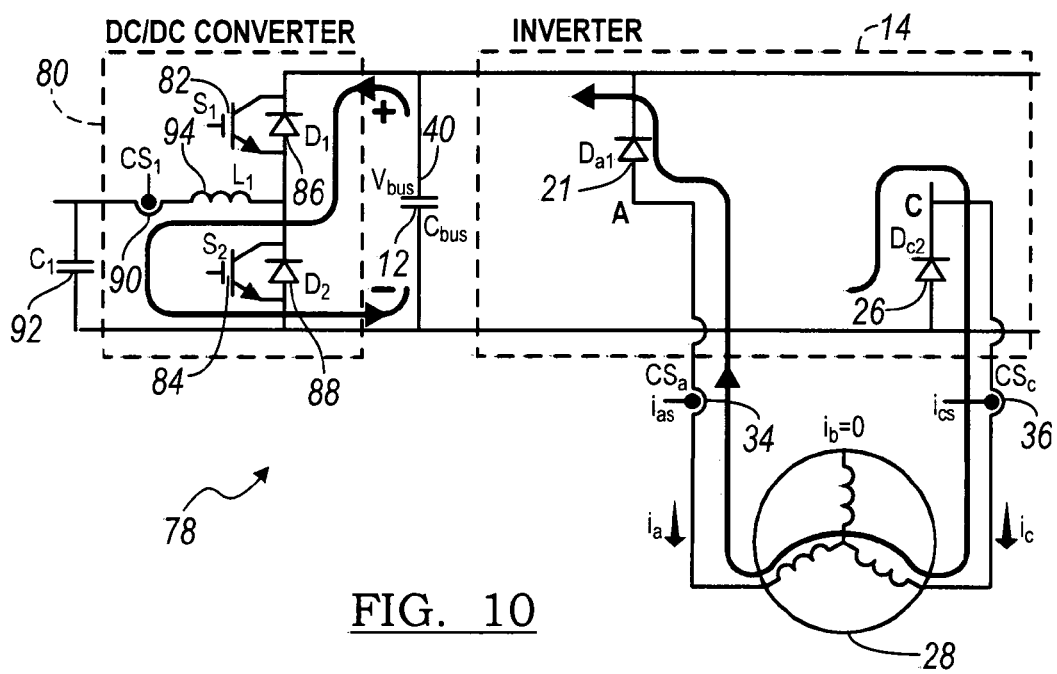
FIG. 10 illustrates recharging the bus capacitor of the motor drive of FIG. 8.

Then, two inverter switches 17 $S_{c1}$ and 18 $S_{a2}$ (in the illustrated example) are turned on in order to drain the energy in capacitors 92 $C_1$ and 12 $C_{bus}$ through the windings of motor 28. After the DC bus voltage is substantially or completely discharged, all switches, including those of converters 80 and inverters 14, are turned off. Then, as shown in FIG. 10, the system 78 conducts motor inductive energy back to the DC bus 40 through the diodes 21 and 26 ($D_{c2}$ and $D_{a1}$, respectively). This boosts the voltage on bus capacitor 12 $C_{bus}$ toward a high value and the motor current is reduced gradually. With switches 82 $S_1$ and 84 $S_2$ remaining off, the voltage on capacitor 92 $C_1$ is still at a low value or zero.

Then, when the voltage on bus capacitor 12 $C_{bus}$ is high enough, switch 82 $S_1$ is turned on, which initiates a free resonance between converter inductor 94 $L_1$ and capacitor 92 $C_1$. By properly choosing the time to turn on switch 82 $S_1$, the resonant current drawn from bus capacitor 12 $C_{bus}$ can be higher than the motor current charging capacitor 12. In other words, there are instances when the net current to bus capacitor 12 $C_{bus}$ is zero as is the slope of the voltage on capacitor 12 $C_{bus}$. Similarly, this can be used as an indicator that the current to converter inductor 94 $L_1$ at those instances equals the motor current $i_{cs}$ or $-i_{as}$.

Parameter identification is closely related to sensor accuracy. After cross-checking current sensors and voltage sensors as described above, it is safe and reliable to implement passive device parameter identification. Passive device parameter identification can be used to predict component life, evaluate possible failure, and initiate a limited operation strategy.

There are three levels of parameter identification:
1. offline parameter identification;
2. semi-online parameter identification; and
3. online parameter identification.

1. Offline Parameter Identification

Offline parameter identification can be performed as a standard check procedure performed at a particular location, such as an automobile dealership, or as a programmed auto self-check routine performed periodically.

Step 1. Passive Discharge

Figure 11:
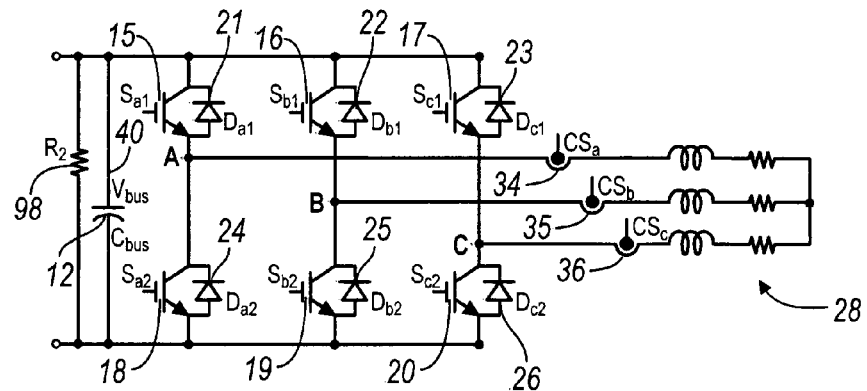
FIG. 11 is a schematic diagram of a hybrid electric traction inverter system without a boost converter.

For a hybrid electric vehicle system without a boost converter, as shown in FIG. 11, the quickest check is to charge the bus capacitor 12 $C_{bus}$ to a certain voltage, then cut the power, and allow bus capacitor 12 to discharge through a bleeding resistor 98. If the voltage on bus capacitor 12 $C_{bus}$ drops from $V_{bus1}$ to $V_{bus2}$, the discharge time can be calculated from the following equation:

$$t = -R_2 \cdot C_{bus} \ln(1 - V_{bus2}/V_{bus1}) \quad (8)$$

If the measured discharge time is close to the calculated value, then it can be safely concluded that both bus capacitor 12 and bleeding resistor 98 have the correct values.

If the discharge time is shorter than expected, either the bleeding resistor 98 is partially shorted or decreased in resistance, or the bus capacitor 12 is deteriorated. In either case, the step two, capacitance and inductance check, shall be performed.

Figure 12:
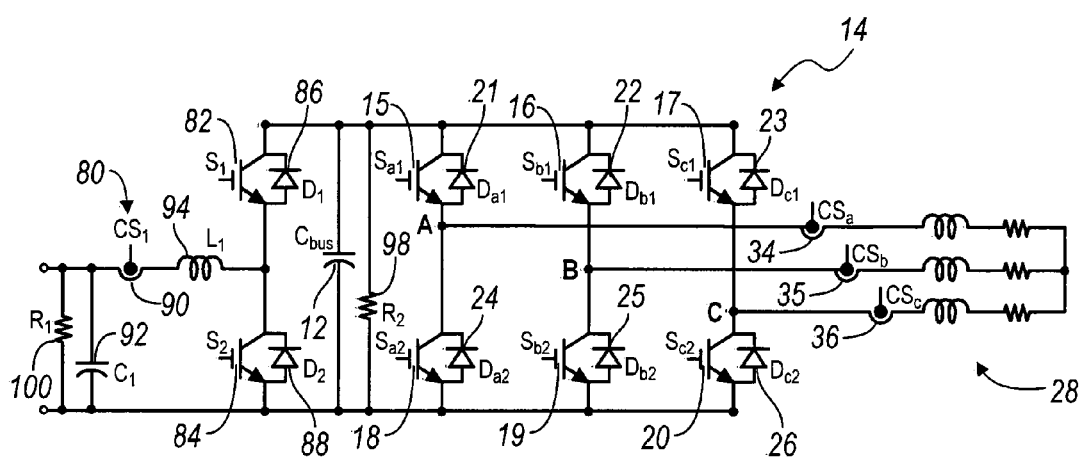
FIG. 12 is a schematic diagram of a hybrid electric traction inverter system with a boost converter.

For a hybrid electric vehicle system with a boost converter 80 and inverter 14, as shown in FIG. 12, the same principle applies. Two capacitors 92 $C_1$ and bus capacitor 12 $C_{bus}$ are charged to the same voltage and discharged through resistors 100 $R_1$ and 98 $R_2$.

To identify each capacitor or resistor, boost is needed to ensure that the bus voltage $V_{bus}$ is greater than $V_1$ in order to block conduction through diode 86 $D_1$.

Step 2. Capacitance and Inductance Check

Figure 13:
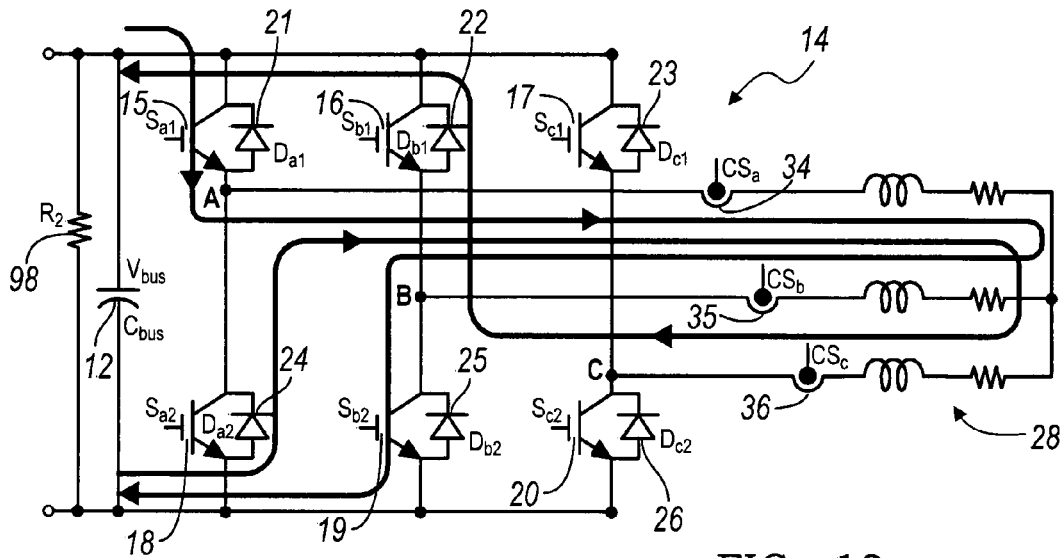
FIG. 13 illustrates current loops for checking the capacitance of a bus capacitor of the inverter system of FIG. 11.
Figure 14:
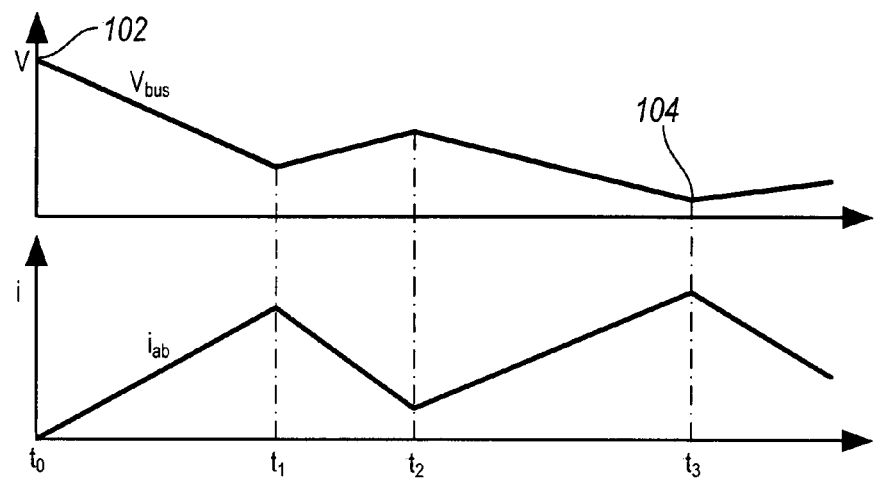
FIG. 14 shows the variation of bus voltage and current in the phase windings of the loop shown in FIG. 13.

Capacitance is checked by an active discharge approach, as described with reference to FIG. 13. The bus capacitor bank 12 is first charged to a predetermined voltage 102. Then two phase legs, e.g., A and B, of the inverter 14 are controlled to achieve current oscillation between the bus capacitor bank 12 and the two motor windings that correspond to the selected phase winding legs. Since the current through the phase windings of the motor is much larger than the leakage current through the bleeding resistor 98, the effect of bleeding resistor 98 can be ignored.

The relationship between the voltage across bus capacitor 12 and the current through the A and B windings of motor 28 is $$C_{bus} \frac{dV_{bus}(t)}{dt} = i_{ab}(t) \quad (9)$$

Thus, the capacitance of bus capacitor 13 can be calculated from $$C_{bus} = \frac{\int_{t_n}^{t_{n+1}} i_{ab}(t) dt}{V_{bus}(t_{n+1}) - V_{bus}(t_n)} \quad (10)$$

Since step two is an offline operation, the switching frequency and duty ratio can be adjusted to an optimized value for sample accuracy. One easy way is to close switch 15 $S_{a1}$ and switch 19 $S_{b2}$ until $V_{bus}$ drops close to zero, and then open switches 15, 17. The current will then be conducted through diode 24, motor windings A and B, and diode 22 to charge bus capacitor 12 $C_{bus}$. In this way, switching noise can be eliminated from the test.

For the system shown in FIG. 12 having a boost converter 80 and inverter 14, the following three sub-steps are used to determine the inductance of converter inductor 94 and the capacitance of bus capacitor 12 and converter capacitor 92.

Figure 15:
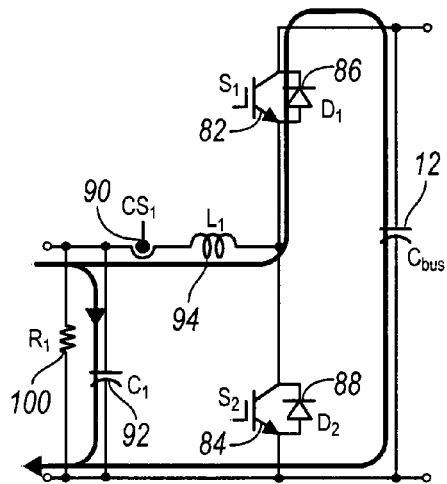
FIG. 15 shows current loops used to precharge the capacitors of the boost converter of FIG. 12.

First, charge capacitors 92, 12 ($C_1$ and $C_{bus}$) to the same voltage using an external pre-charge circuit, as shown in FIG. 15. During this step, there is a chance that the total capacitance of capacitors 92, 12 ($C_1$ and $C_{bus}$) can be checked if the pre-charge circuit is very well regulated.

Figure 16:
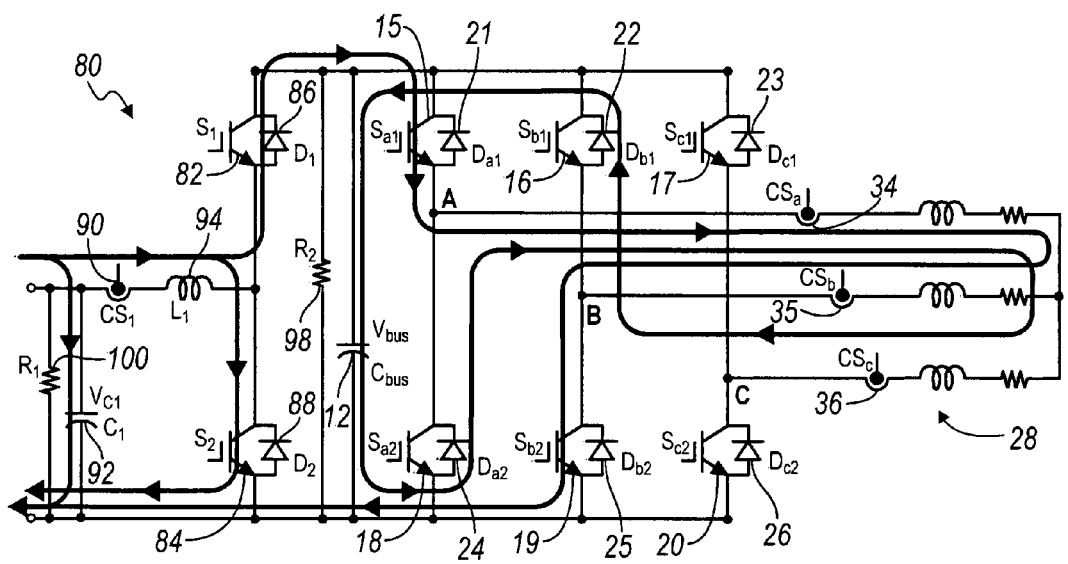
FIG. 16 shows current loop used to estimate inductance in the boost converter of FIG. 12.

Second, boost the voltage in bus capacitor 12 $C_{bus}$ to a predetermined voltage in continuous current mode by operating switches 84 $S_2$, 15 $S_{a1}$, and 19 $S_{b2}$, as shown in FIG. 16. During this step, the inductance of inductor 94 in the boost converter 80 can be calculated using equation (11) upon measuring the voltage and current $$L_1 = \frac{V_{C1} \cdot T_{on}}{\Delta I_{L1}}, \quad (11)$$

wherein $T_{on}$ is length of the period during which switch 84 $S_2$ is on, and $\Delta I_{L1}$ is the inductor current change during that period.

Figure 17:
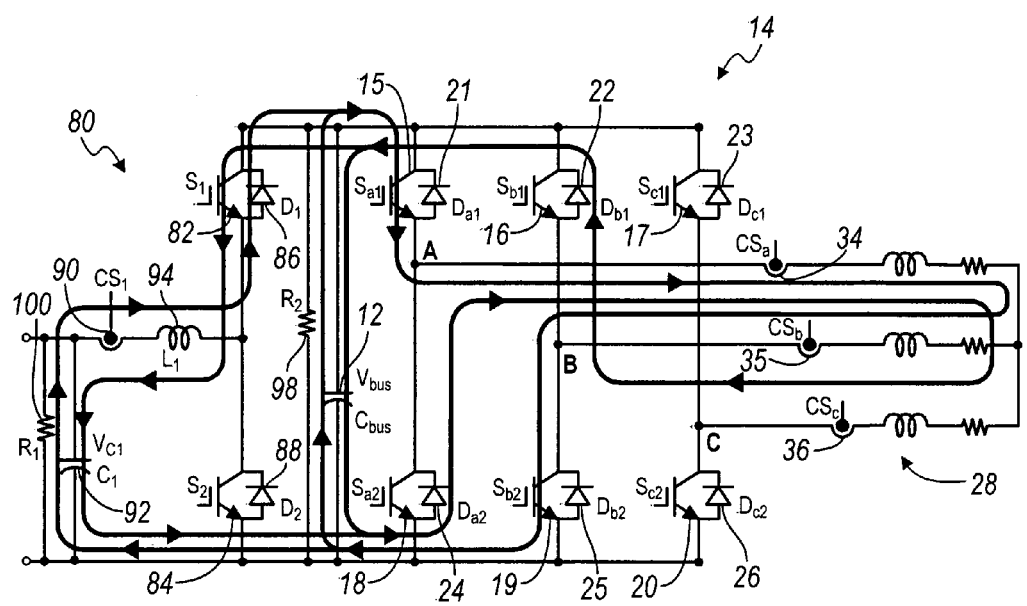
FIG. 17 shows a loop used to estimate capacitances in the boost converter of FIG. 12.

Third, discharge capacitor 92 $C_1$ and bus capacitor 12 $C_{bus}$ by changing the states of switches $S_1$, $S_{a1}$ and $S_{b2}$ on and off, as shown in FIG. 17. In this case, switch 82 $S_1$ is turned off at the beginning. Since bus capacitor 12 $C_{bus}$ has a higher voltage than capacitor 92 $C_1$, only bus capacitor 12 $C_{bus}$ will be discharged; therefore, the capacitance of bus capacitor 12 $C_{bus}$ can be estimated using equation (10). When $V_{bus}$ decreases to the same level as $V_{C1}$, switch 82 $S_1$ is turned on, both capacitors 92, 12 begin to oscillate with the motor windings, thus the total capacitance can be estimated. Using the capacitance of bus capacitor 12 $C_{bus}$ estimated from equation (10) and the estimated total capacitance, the capacitance of capacitor 92 $C_1$ can be calculated.

2. Semi-online Parameter Identification

While the vehicle is shutdown, sub-steps 2 and 3, discussed above, can be performed to check the inductance and capacitance.

3. Online Parameter Identification

When the vehicle is running, inductance of $L_1$ can always be checked using equation (11).

In accordance with the provisions of the patent statutes, the preferred embodiment has been described. However, it should be noted that the alternate embodiments can be practiced otherwise than as specifically illustrated and described.

What is claimed is:

1. A method for checking a multi-phase-motor-drive, comprising the steps of:
   (a) adjusting inverter switches of the motor-drive to produce a series loop that includes a bus capacitor, two of the switches, first and second phase motor windings, and first and second current sensors;
   (b) discharging the capacitor through the loop;
   (c) checking accuracy of the sensors by comparing current in the first and second current sensors.

2. The method of claim 1, further comprising:
   using a third current sensor to determine a magnitude of current in the third phase winding; and
   determining a current offset of the third phase winding.

3. The method of claim 1, further comprising:
   determining the voltage across the capacitor bank;
   using the first current sensor and the second current sensor to determine the loop current; and
   using the loop current and the voltage across the bus capacitor to estimate the inductance of the first and second phase windings.

4. The method of claim 3, further comprising:
   changing the state of the switches to produce a second loop that includes the first and second phase windings, the first current sensor, and the second current sensor; and
   using the estimated inductance of the first and second phase windings to estimate the forward-voltage drop across the first and second phase switches.

5. In a motor drive that includes a bus capacitor, a first multi-phase motor, a first multi-phase inverter connecting the bus capacitor with the first motor, a second multi-phase motor, a second multi-phase inverter in parallel with the first inverter and connecting the bus capacitor with each phase winding of the second motor, multiple switches, each switch having an on-state and an off-state and being in series with a phase winding, and multiple current sensors, each current sensor being in series with respective phase winding, a method, comprising the steps of:
   exhausting energy in the bus capacitor;
   allowing current to circulate through phase windings of the first motor and phase windings of the second motor;
   increasing a magnitude of voltage across the bus capacitor;
   monitoring the rate of change of voltage across the bus capacitor;
   checking accuracy of the sensors by comparing current in the current sensors when the rate of change of voltage across the bus capacitor becomes zero.

6. The method of claim 5 wherein the motor drive includes a DC power source, and the step of exhausting energy in the bus capacitor further includes the steps of:
   disconnecting the power source;
   using the switches to deliver current to the phase windings of the first motor and the second motor until energy in the bus capacitor is exhausted.

7. The method of claim 5 wherein the step of increasing the magnitude of voltage across the bus capacitor further includes the step of:
   adjusting the state of the switches in the second inverter such that current in the phase windings of the first motor become equal to the current in the phase windings of the second motor.

8. The method of claim 5 wherein the step of increasing the magnitude of voltage across the bus capacitor further includes the step of:
   turning off the switches of the second inverter;
   allowing current in the phase windings of the second motor to flow through the second inverter to the bus capacitor; and
   allowing current in the phase windings of the first motor to flow from the bus capacitor through the first inverter and first motor to the bus capacitor, thereby increasing a voltage across the bus capacitor, due to having a net positive current to the capacitor.

9. In a multi-phase motor drive that includes a capacitor bank, a multi-phase motor, a multi-phase inverter connecting the bus capacitor with each phase winding of the motor, including multiple inverter switches, each inverter switch having an on-state and an off-state and being in series with a phase winding, and multiple inverter current sensors, each inverter current sensor being in series with a respective phase winding, and a boost DC/DC converter connected across the bus capacitor and including a converter inductor, a converter capacitor, multiple converter switches, and a converter current sensor located in a current path between the converter inductor and the converter capacitor, a method comprising the steps of:
   exhausting energy in the bus capacitor and the converter capacitor;
   recharging the bus capacitor by conducting motor inductive energy to said capacitor;
   producing free resonance between the converter inductor and the converter capacitor by drawing current from the bus capacitor;
   checking accuracy of the converter current sensor and inverter current sensors by comparing current in each current sensors when the net current to the bus capacitor is substantially zero.

10. The method of claim 9 wherein the motor drive includes a DC power source, and the step of exhausting energy in the bus capacitor and the inverter capacitor further includes the step of:
    disconnecting the power source;
    using the inverter switches to drain current from the bus capacitor and converter capacitor through the phase windings of the motor.

11. The method of claim 9 wherein the step of recharging the bus capacitor further comprises the steps of:
    turning off the inverter switches and the converter switches;
    conducting that motor inductive energy to the bus capacitor;
    increasing a voltage across the bus capacitor; and
    reducing current through the phase windings.

12. The method of claim 9 wherein the step of producing free resonance further comprises the steps of:
    turning on at least one of the converter switches; and
    electrically connecting the converter inductor and the converter capacitor.

13. A method for checking a multi-phase-motor-drive, comprising:
    charging the bus capacitor and a capacitor of a DC/DC converter to a first voltage;
    calculating inductance of a DC/DC converter inductor while charging the bus capacitor to a predetermined voltage through two of the motor windings and an inverter connected to the windings and said capacitor;
    replacing said inductor if a nominal inductance of said inductor is substantially different than the calculated inductance.

14. The method of claim 13 further comprising the steps of:
discharging the bus capacitor and a capacitor of the DC/DC converter through the two motor windings and the DC/DC converter during a predetermined interval;
calculating capacitance of the bus capacitor using measured rate of change of current in the bus capacitor and the change in voltage across the bus capacitor during said interval;
replacing the bus capacitor if the nominal capacitance of the bus capacitor is substantially different than the calculated capacitance of the bus capacitor.

15. The method of claim 14, further comprising the steps of:
determining the total capacitance of the motor drive by causing the bus capacitor and the capacitor of the DC/DC converter to oscillate with the two motor windings;
calculating capacitance of the capacitor of the DC/DC converter using said total capacitance and the capacitance of the bus capacitor; and
replacing the capacitor of the DC/DC converter if the nominal capacitance of the capacitor of the DC/DC converter is substantially different than the calculated capacitance of the DC/DC converter.

16. The method of claim 13 further comprising the step of:
discharging the bus capacitor through the first and second phase windings during a predetermined interval until the voltage across the bus capacitor approaches zero voltage; and
using inverter switches to produce a first loop that includes the bus capacitor, a first phase winding, a first current sensor that indicates current in a first phase winding, a second phase winding, and a second current sensor that indicates current in the second phase winding.

17. The method of claim 16 wherein step of charging the bus capacitor through the first and second phase windings further comprises the step of:
switching the state of the switches used to produce the first loop.

18. The method of claim 13 further comprising the step of using the motor drive with the current bus capacitance if the measured discharge period is substantially equal to the calculated discharge period.

19. The method of claim 13 further comprising the step of replacing either a bleed resistor or a connection between the bleed resistor and the motor drive if the measured discharge period is longer than the calculated discharge period.

20. The method of claim 13 further comprising the step of replacing the inductor in the DC/DC converter if the inductance is smaller than a predetermined value.

21. A method for checking of a multi-phase-motor-drive, comprising:
charging a bus capacitor connected between an inverter and motor windings;
producing current oscillation between said capacitor and two of the motor windings;
calculating capacitance of the said capacitor use a measured voltage across said capacitor and current through the windings;
replacing said capacitor if a nominal capacitance of said capacitor is different from the calculated capacitance.

* * * * *